US010224320B2

(12) United States Patent
Takeuchi

(10) Patent No.: US 10,224,320 B2
(45) Date of Patent: Mar. 5, 2019

(54) SEMICONDUCTOR DEVICE

(71) Applicant: Kabushiki Kaisha Toshiba, Minato-ku, Tokyo (JP)

(72) Inventor: Fumio Takeuchi, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 15/708,289

(22) Filed: Sep. 19, 2017

(65) Prior Publication Data

US 2018/0277531 A1    Sep. 27, 2018

(30) Foreign Application Priority Data

Mar. 24, 2017   (JP) ................... 2017-060013

(51) Int. Cl.
| H01L 27/02 | (2006.01) |
| H01L 29/78 | (2006.01) |
| H01L 29/167 | (2006.01) |
| H01L 29/08 | (2006.01) |
| H01L 29/10 | (2006.01) |

(52) U.S. Cl.
CPC ........ *H01L 27/027* (2013.01); *H01L 29/0878* (2013.01); *H01L 29/0886* (2013.01); *H01L 29/1095* (2013.01); *H01L 29/167* (2013.01); *H01L 29/7816* (2013.01)

(58) Field of Classification Search
CPC ............... H01L 27/027; H01L 29/0886; H01L 29/1095; H01L 29/167; H01L 29/7816
See application file for complete search history.

(56) References Cited

U.S. PATENT DOCUMENTS

| 8,546,877 B2 | 10/2013 | Akai |
| 8,637,928 B2 | 1/2014 | Obatake et al. |
| 9,711,497 B2 * | 7/2017 | Fukasaku ............ H01L 27/0248 |

(Continued)

FOREIGN PATENT DOCUMENTS

| JP | 2008-091445 A | 4/2008 |
| JP | 2008-270367 A | 11/2008 |
| JP | 2011-204924 A | 10/2011 |

*Primary Examiner* — Nathan W Ha
(74) *Attorney, Agent, or Firm* — White & Case LLP

(57) ABSTRACT

A semiconductor device according to an embodiment includes a semiconductor substrate having a first plane and a second plane, a plurality of first semiconductor areas provided on the first plane, a plurality of second semiconductor areas provided between the plurality of first semiconductor areas, a plurality of insulator regions provided between the first semiconductor areas and the second semiconductor areas, first-conductivity-type drain regions provided in the first semiconductor areas, first-conductivity-type source regions provided in the second semiconductor areas, gate electrodes, first-conductivity-type first impurity regions that are provided between the first-conductivity-type drain regions and the second plane and have a lower first-conductivity-type impurity concentration than the first-conductivity-type drain regions, and a plurality of second-conductivity-type second impurity regions provided between the first-conductivity-type source regions and the second plane. The width of at least one of the plurality of first semiconductor areas is greater than the width of the other first semiconductor areas.

10 Claims, 5 Drawing Sheets

(56) References Cited

U.S. PATENT DOCUMENTS

| | | | | |
|---|---|---|---|---|
| 2014/0159206 A1* | 6/2014 | Hsu | ............... | H01L 29/735 257/565 |
| 2014/0183622 A1* | 7/2014 | Lin | ............... | H01L 29/47 257/329 |
| 2014/0339601 A1* | 11/2014 | Salcedo | ............... | H01L 27/0262 257/140 |
| 2015/0364463 A1* | 12/2015 | Suzuki | ............... | H01L 27/0255 257/355 |
| 2015/0372134 A1* | 12/2015 | Chan | ............... | H01L 27/027 257/328 |
| 2016/0064372 A1* | 3/2016 | Singh | ............... | H01L 27/088 257/355 |
| 2016/0079348 A1* | 3/2016 | Iwatsu | ............... | H01L 29/0623 257/141 |
| 2018/0061980 A1* | 3/2018 | Ohoka | ............... | H01L 29/7815 |

* cited by examiner

SEMICONDUCTOR DEVICE

CROSS-REFERENCE TO RELATED APPLICATION

This application is based upon and claims the benefit of priority from Japanese Patent Application No. 2017-060013, filed on Mar. 24, 2017, the entire contents of which are incorporated herein by reference.

FIELD

Embodiments described herein relate generally to semiconductor devices.

BACKGROUND

A task is to increase electrostatic discharge (ESD) resistance, in addition to reducing the size of a chip in a high-breakdown-voltage laterally diffused metal oxide semiconductor (LDMOS) transistor. A technique is expected which improves the ESD resistance without sacrificing characteristics such as on-resistance (RonA) per unit area.

DETAILED DESCRIPTION

Figure 1:
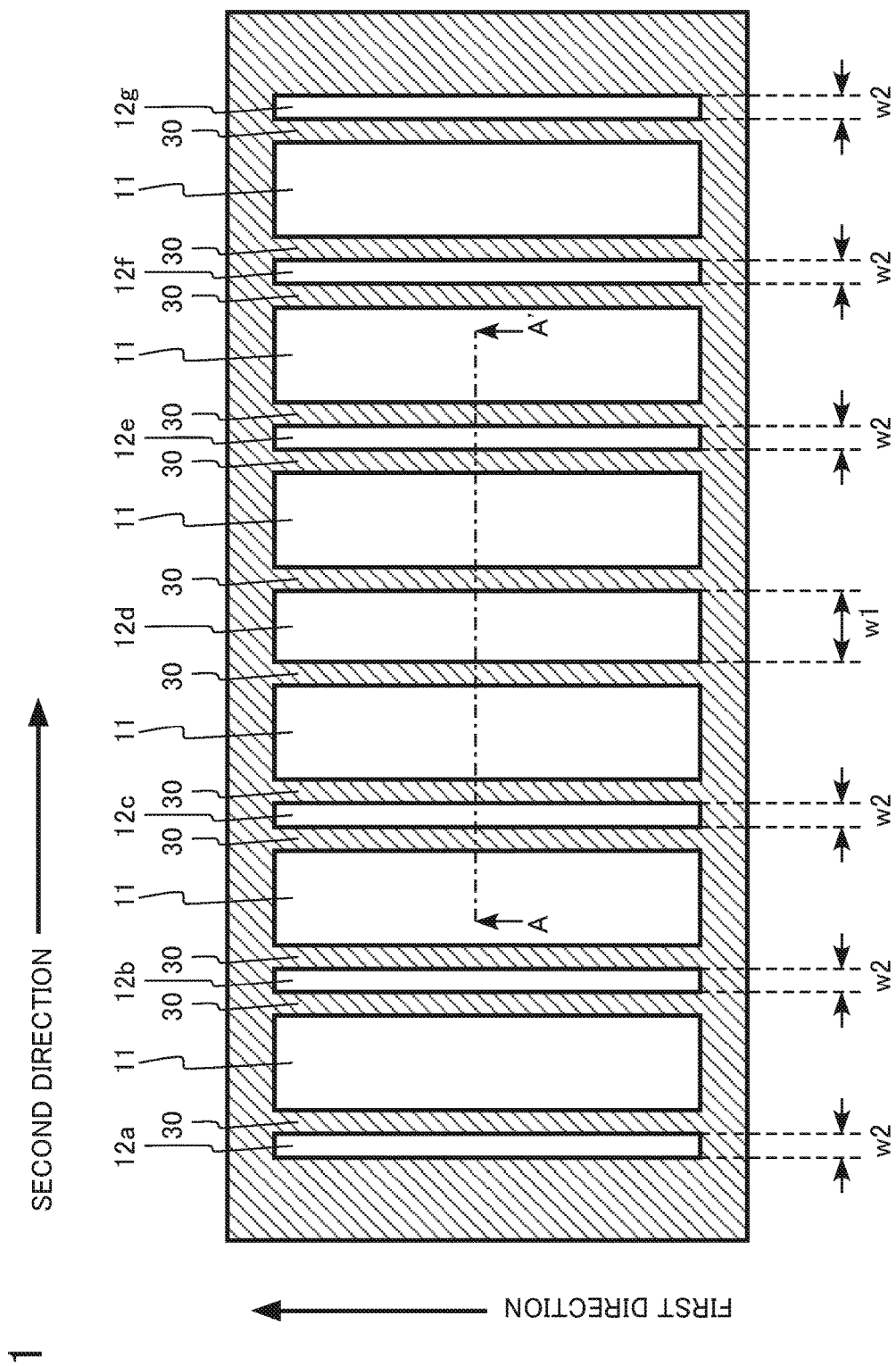
FIG. 1 is a diagram schematically illustrating a semiconductor device according to a first embodiment.

A semiconductor device according to an embodiment includes: a semiconductor substrate having a first plane and a second plane; a plurality of first semiconductor areas provided on the first plane, the first semiconductor areas extending in a first direction; a plurality of second semiconductor areas provided on the first plane, the plurality of second semiconductor areas extending in the first direction, the plurality of second semiconductor areas being provided between the plurality of first semiconductor areas; a plurality of insulator regions provided on a first plane side of the semiconductor substrate, the plurality of insulator regions being provided between the plurality of first semiconductor areas and the plurality of second semiconductor areas; a plurality of first-conductivity-type drain regions provided in the plurality of first semiconductor areas; a plurality of first-conductivity-type source regions provided in the plurality of second semiconductor areas; a plurality of gate electrodes provided between the plurality of first-conductivity-type drain regions and the plurality of first-conductivity-type source regions, the plurality of gate electrodes provided above the plurality of second semiconductor areas and the plurality of insulator regions; a plurality of first-conductivity-type first impurity regions provided between the plurality of first-conductivity-type drain regions and the second plane, the plurality of first-conductivity-type first impurity regions having a lower first-conductivity-type impurity concentration than the plurality of first-conductivity-type drain regions; and a plurality of second-conductivity-type second impurity regions provided between the plurality of first-conductivity-type source regions and the second plane, wherein a width of at least one first semiconductor area among the plurality of first semiconductor areas is greater than a width of the other first semiconductor areas.

In the specification, in some cases, the same or similar members are denoted by the same reference numerals and the description thereof will not be repeated.

In the specification, in some cases, in order to show the positional relationship between, for example, components, the upper direction in the drawings may be described as "on" or "above", and the lower direction in the drawings may be described as "under" or "below". In the specification, the terms "on", "above", "under" and "below" do not necessarily indicate the relationship with the direction of gravity.

In the following description, $n^+$, $n$, $n^-$, $p^+$, $p$, and $p^-$ indicate the relative impurity concentration levels of each conductivity type. That is, $n^+$ indicates an n-type impurity concentration which is higher than that of n and $n^-$ indicates an n-type impurity concentration which is lower than that of n. In addition, $p^+$ indicates a p-type impurity concentration which is higher than that of p and $p^-$ indicates a p-type impurity concentration which is lower than that of p. In some cases, an $n^+$ type and an $n^-$ type are simply represented by an n type and a $p^+$ type and a $p^-$ type are simply represented by a p type.

Impurity concentration can be measured by, for example, secondary ion mass spectrometry (SIMS). In addition, the relative levels of the impurity concentration can be determined from the levels of carrier concentration calculated by, for example, scanning capacitance microscopy (SCM). The distance of an impurity region, such as the depth or thickness of the impurity region, can be calculated by, for example, SIMS. Furthermore, the distance of the impurity region, such as the depth, thickness, width, or interval of the impurity region, can be calculated from, for example, a composite image of an SCM image and an atomic force microscope (AFM) image.

First Embodiment

A semiconductor device according to an embodiment includes: a semiconductor substrate having a first plane and a second plane; a plurality of first semiconductor areas that are provided on a first plane side of the semiconductor substrate and extend in a first direction; a plurality of second semiconductor areas that are provided on the first plane side of the semiconductor substrate, extend in the first direction, and are provided between the plurality of first semiconductor areas; a plurality of insulator regions that are provided on the first plane side of the semiconductor substrate and are provided between the plurality of first semiconductor areas and the plurality of second semiconductor areas; a plurality of first-conductivity-type drain regions provided in the plurality of first semiconductor areas; a plurality of first-conductivity-type source regions provided in the plurality of second semiconductor areas; a plurality of gate electrodes provided between the plurality of first-conductivity-type drain regions and the plurality of first-conductivity-type source regions above the plurality of second semiconductor areas and the plurality of insulator regions; a plurality of first-conductivity-type first impurity regions that are provided between the plurality of first-conductivity-type drain regions and the second plane and have a lower first-conductivity-type impurity concentration than the plurality of first-conductivity-type drain regions; and a plurality of second-conductivity-type second impurity regions provided between the plurality of first-conductivity-type source regions and the second plane. A width of at least one first semiconductor area among the plurality of first semiconductor areas is greater than a width of the other first semiconductor areas.

Figure 2:
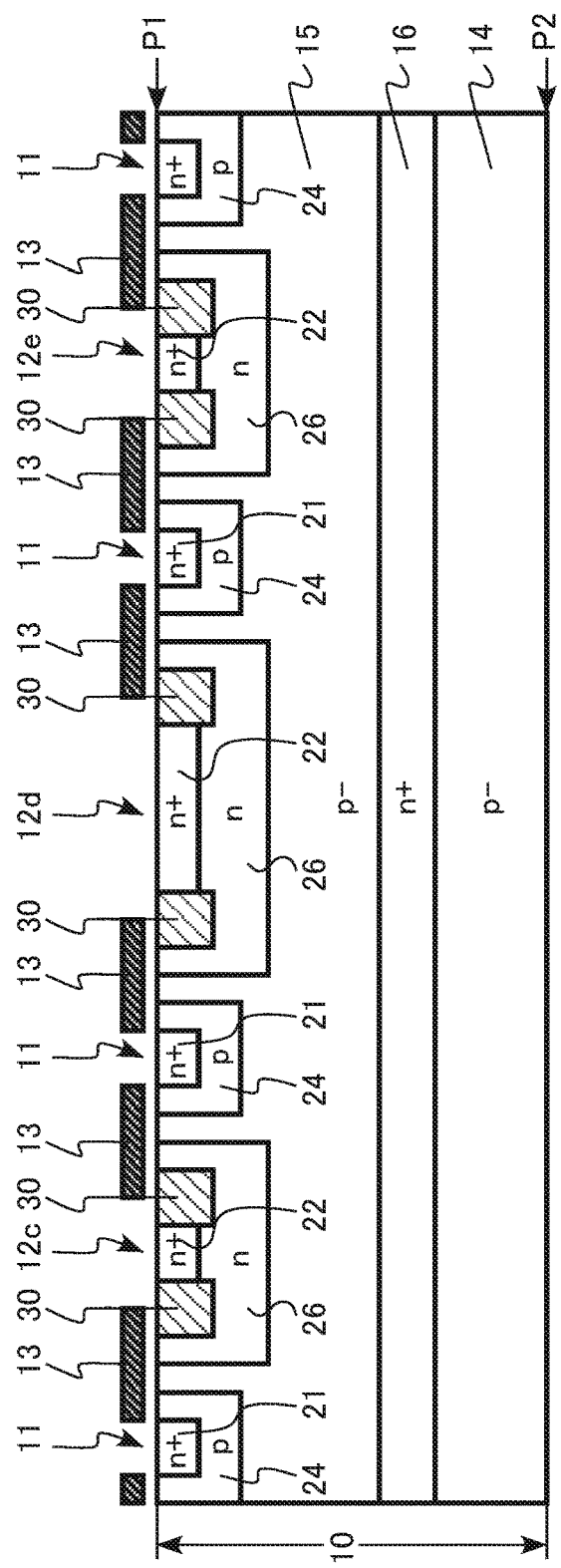
FIG. 2 is a diagram schematically illustrating the semiconductor device according to the first embodiment.

FIGS. 1 and 2 are diagrams schematically illustrating the semiconductor device according to this embodiment. FIG. 1 is a top view and FIG. 2 is a cross-sectional view taken along the line AA' of FIG. 1.

The semiconductor device according to this embodiment is a semiconductor device including an n-channel LDMOS transistor. FIGS. 1 and 2 are diagrams schematically illustrating the n-channel LDMOS transistor. In this embodiment, a first conductivity type is an n type and a second conductivity type is a p type.

The n-channel LDMOS transistor includes a semiconductor substrate 10 and a plurality of gate electrodes 13. The semiconductor substrate 10 includes a plurality of source active areas 11 (second semiconductor areas), a plurality of drain active areas 12a, 12b, 12c, 12d, 12e, 12f, and 12g (first semiconductor areas), and a plurality of isolation regions 30 (insulator regions). In addition, the semiconductor substrate 10 includes a first p-type region 14 (third impurity region) which is a p⁻ region, a second p-type region 15 (fifth impurity region) which is a p⁻ region, an n⁺ buried region 16 (fourth impurity region), a plurality of n⁺ source regions 21, a plurality of n⁺ drain regions 22, a plurality of p-type p well regions 24 (second impurity regions), and a plurality of n-type drift regions 26 (first impurity regions).

The semiconductor substrate 10 has a first plane (P1 in FIG. 2) and a second plane (P2 in FIG. 2). The first plane is a front surface of the semiconductor substrate 10 and the second plane is a rear surface of the semiconductor substrate 10.

The semiconductor substrate 10 is, for example, a silicon (Si) single-crystal substrate. The first plane is, for example, the (001) face of silicon.

The drain active areas 12a, 12b, 12c, 12d, 12e, 12f, and 12g are provided on the front surface side of the semiconductor substrate 10. The drain active areas 12a, 12b, 12c, 12d, 12e, 12f, and 12g are arranged in a second direction. The drain active areas 12a, 12b, 12c, 12d, 12e, 12f, and 12g extend in a first direction.

Among the drain active areas 12a, 12b, 12c, 12d, 12e, 12f, and 12g, the width (w1 in FIG. 1) of the drain active area 12d is greater than the width (w2 in FIG. 1) of the other drain active areas 12a, 12b, 12c, 12e, 12f, and 12g.

The width of the drain active area 12d is, for example, equal to or greater than 1.2 μm. The width of the drain active areas 12a, 12b, 12c, 12e, 12f, and 12g is, for example, equal to or less than 0.5 μm. For example, the width of the drain active area 12d is equal to or greater than two times the width of the drain active areas 12a, 12b, 12c, 12e, 12f, and 12g.

The source active area 11 is provided on the front surface side of the semiconductor substrate 10. A plurality of source active areas 11 are arranged in the second direction. The source active area 11 extends in the first direction. The source active area 11 is provided between two drain active areas (12a, 12b, 12c, 12d, 12e, 12f, and 12g). The source active area 11 is interposed between two isolation regions 30.

The isolation region 30 is provided on the front surface side of the semiconductor substrate 10. A plurality of isolation regions 30 are arranged in the second direction. The isolation region 30 extends in the first direction. The isolation regions 30 are provided between any one of the drain active areas 12a, 12b, 12c, 12d, 12e, 12f, and 12g and the source active areas 11. The ends of the isolation regions 30 in the first direction may be connected to each other.

For example, the isolation region 30 is formed by filling a groove formed in the semiconductor substrate 10 with an insulator. The isolation region 30 is a so-called shallow trench isolation (STI) region. The insulator is, for example, silicon oxide.

The gate electrode 13 is provided above the front surface of the semiconductor substrate 10. A plurality of gate electrodes 13 are arranged in the second direction. For example, the gate electrode 13 extends in the first direction. The gate electrodes 13 are provided between any one of the drain active areas 12a, 12b, 12c, 12d, 12e, 12f, and 12g and the source active areas 11. The gate electrode 13 is provided above the source active area 11 and the isolation region 30.

The gate electrode 13 is made of, for example, polysilicon doped with impurities. A gate insulating layer (not illustrated) is provided between the gate electrode 13 and the source active area 11.

The first type region 14 which is a p⁻ region is provided in the semiconductor substrate 10. The first p-type region 14 includes, for example, boron (B) as p-type impurities. The p-type impurity concentration of the first p-type region 14 is, for example, equal to or greater than $1 \times 10^{15}$ cm⁻³ and equal to or less than $1 \times 10^{16}$ cm⁻³.

The second p-type region 15 which is a p⁻ region is provided in the semiconductor substrate 10. The second p-type region 15 includes, for example, boron (B) as p-type impurities. The p-type impurity concentration of the second p-type region 15 is, for example, equal to or greater than $1 \times 10^{15}$ cm⁻³ and equal to or less than $1 \times 10^{16}$ cm⁻³.

The n⁺ buried region 16 is provided in the semiconductor substrate 10. The buried region 16 is provided between the first p-type region 14 and the second p-type region 15. The buried region 16 separates the first p-type region 14 from the second p-type region 15.

The buried region 16 includes, for example, antimony (Sb). The n-type impurity concentration of the buried region 16 is, for example, equal to or greater than $1 \times 10^{20}$ cm⁻³ and equal to or less than $1 \times 10^{22}$ cm⁻³.

The buried region 16 is fixed to, for example, a ground potential. The buried region 16 is, for example, in a floating state.

A plurality of n drain regions 22 are provided in the semiconductor substrate 10. The drain regions 22 are provided in the drain active areas 12a, 12b, 12c, 12d, 12e, 12f, and 12g. A plurality of drain regions 22 are arranged in the second direction. The drain region 22 extends in the first direction. The drain regions 22 may not be necessarily provided in the entire surface of each of the drain active areas 12a, 12b, 12c, 12d, 12e, 12f, and 12g.

The drain region 22 includes, for example, phosphorus (P) or arsenic (As) as n-type impurities. The n-type impurity concentration of the drain region 22 is, for example, equal to or greater than $1 \times 10^{20}$ cm⁻³ and equal to or less than $1 \times 10^{22}$ cm⁻³.

A plurality of n⁺ source regions 21 are provided in the semiconductor substrate 10. The source region 21 is provided in the source active area 11. A plurality of source regions 21 are arranged in the second direction. The source region 21 extends in the first direction.

The source region 21 includes, for example, phosphorus (B) or arsenic (As) as n-type impurities. The n-type impurity concentration of the source region 21 is, for example, equal to or greater than $1\times10^{20}$ cm$^{-3}$ and equal to or less than $1\times10^{22}$ cm$^{-3}$.

A plurality of p well regions 24 are provided in the semiconductor substrate 10. The p-type p well region 24 is provided between the source regions on 21 and the rear surface. The p well region 24 is provided between the source region 21 and the second p-type region 15.

The p well region 24 includes, for example, boron (B) as p-type impurities. The p-type impurity concentration of the p well region 24 is higher than the p-type impurity concentration of the second p-type region 15. The p-type impurity concentration of the p well region 24 is, for example, equal to or greater than $1\times10^{17}$ cm$^{-3}$ and equal to or less than $1\times10^{19}$ cm$^{-3}$.

A portion of the p well region 24 which faces the gate electrode 13 functions as a channel region of the LDMOS transistor.

A plurality of n-type drift regions 26 are provided in the semiconductor substrate 10. The drift region 26 is provided between the drain region 22 and the rear surface. The drift region 26 is provided between the drain region 22 and the second p-type region 15.

The drift region 26 includes, for example, phosphorus (P) or arsenic (As) as n-type impurities. The n-type impurity concentration of the drift region 26 is less than the n-type impurity concentration of the drain region 22. The n-type impurity concentration of the drift region 26 is, for example, equal to or greater than $1\times10^{17}$ cm$^{-3}$ and equal to or less than $1\times10^{19}$ cm$^{-3}$.

Next, the function and effect of the semiconductor device according to this embodiment will be described.

Figure 3A:
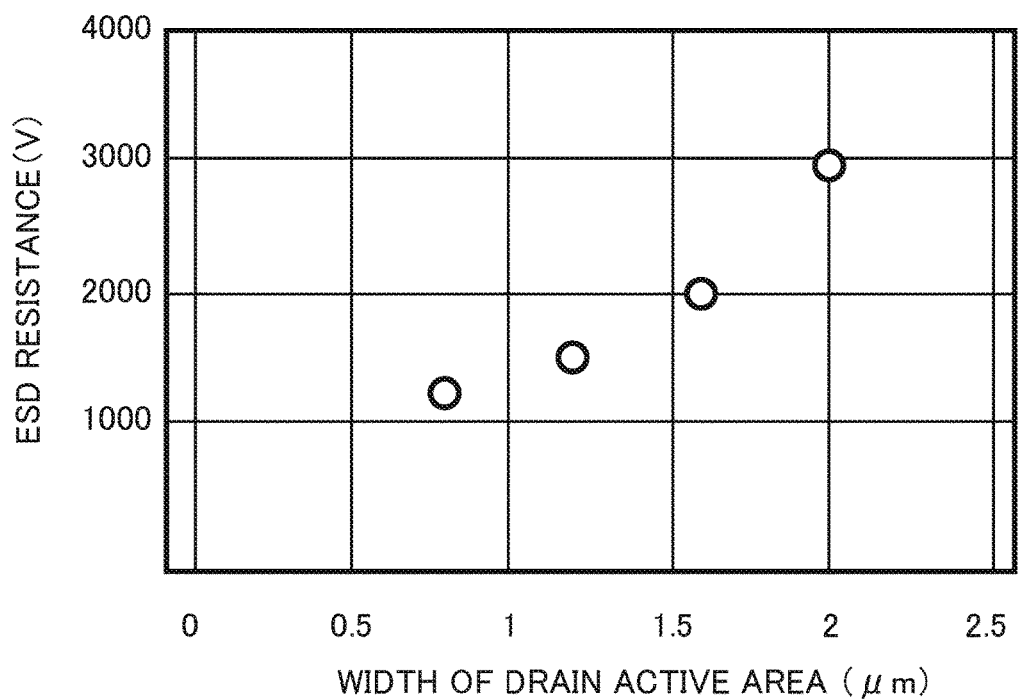
FIGS. 3A and 3B are diagrams illustrating the function and effect of the semiconductor device according to the first embodiment.
Figure 3B:
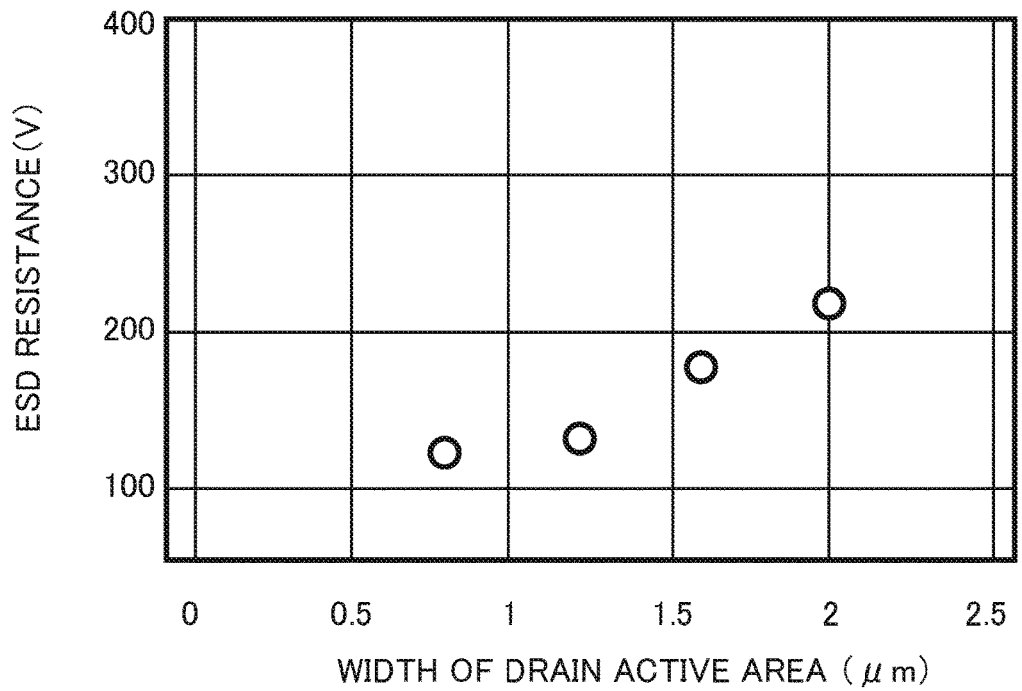

FIGS. 3A and 3B are diagrams illustrating the function and effect of the semiconductor device according to this embodiment. FIGS. 3A and 3B are graphs illustrating the relationship between the width of the drain active area and ESD resistance. FIG. 3A illustrates a human body model (HBM) and FIG. 3B illustrates a machine model (MM).

In both the human body model and the machine model, the ESD resistance is improved as the width of the drain active area increases. In particular, the rate of increase in the ESD resistance is high in a region in which the width of the drain active area is equal to or greater than 1.2 μm. In addition, when the width of the drain active area is increased by two times or more, the ESD resistance is improved by about two times.

Figure 4:
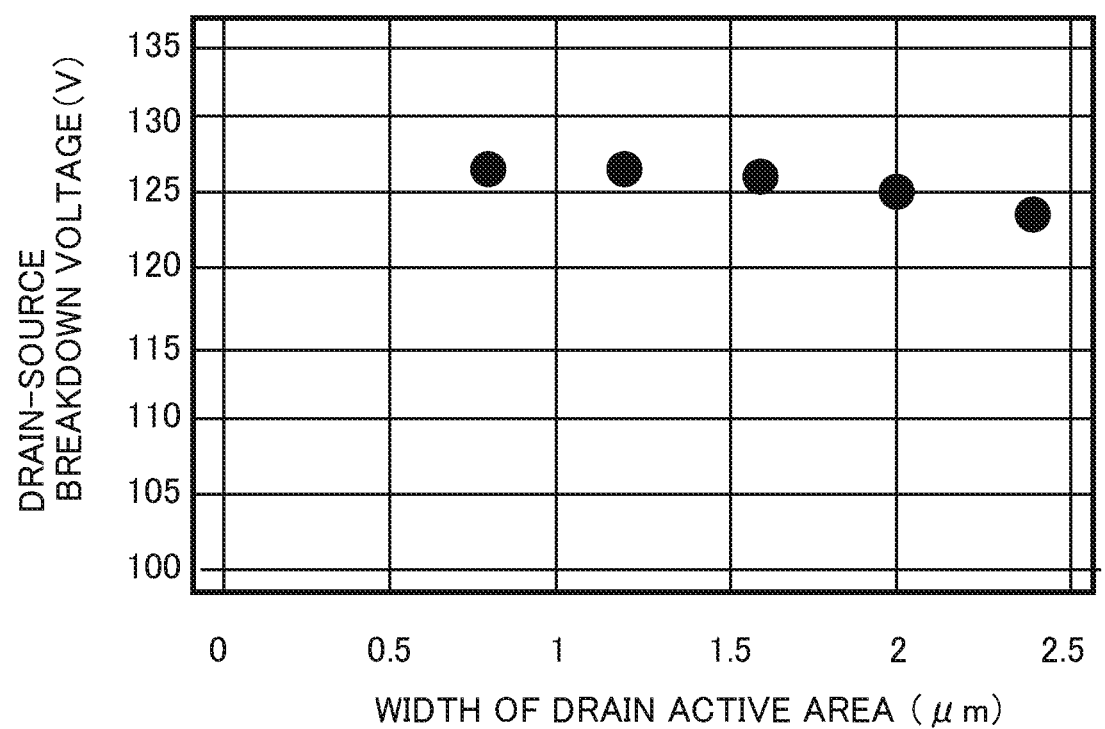
FIG. 4 is a diagram illustrating the function and effect of the semiconductor device according to the first embodiment.

FIG. 4 is a diagram illustrating the function and effect of the semiconductor device according to this embodiment. FIG. 4 is a graph illustrating the relationship between the width of the drain active area and a drain-source breakdown voltage.

As the width of the drain active area increases, the drain-source breakdown voltage tends to be reduced.

In order to clarify the reason for the dependence of the ESD resistance on the width of the drain active area and the dependence of the drain-source breakdown voltage on the width of the drain active area, the electric field distribution of a transistor was simulated while the width of the drain active area was changed. The simulation results proved that, when the width of the drain active area was small, the electric field was concentrated immediately below the drain. It is considered that electrostatic breakdown is likely to occur before a current is drawn from the transistor since the electric field is concentrated immediately below the drain when the width of the drain active area is small.

The absolute value of the electric field below the isolation region or in the vicinity of the source region is greater than that immediately below the drain. Therefore, it is considered that, in a case in which, when the width of the drain active area is small, the electric field is concentrated immediately below the drain, the electric field is dispersed and the absolute value of the electric field is small. As a result, it is considered that, when the width of the drain active area is small, the drain-source breakdown voltage is high.

As can be seen from FIGS. 3A and 3B, the width of the drain active area may increase in order to improve the ESD resistance. However, when the width of all of the drain active areas increases, on-resistance (RonA) per unit area increases. As a result, the area of a chip increases.

In this embodiment, among the drain active areas 12a, 12b, 12c, 12d, 12e, 12f, and 12g, the width of only some of the drain active areas increases. Specifically, the width of only the drain active area 12d increases.

Since the width of some of the drain active areas increases, the ESD resistance of the n-channel LDMOS transistor is improved. Since the width of all of the drain active areas does not increase, but the width of only some of the drain active areas increases, an increase in the on-resistance RonA is prevented.

It is considered that the reason why the ESD resistance is improved even when the width of only some of the drain active areas increases is as follows.

The drain active area 12d with a large width has a higher ESD resistance than the other drain active areas 12a, 12b, 12c, 12e, 12f, and 12g. The drain active area 12d with a large width has a lower drain-source breakdown voltage than the other drain active areas 12a, 12b, 12c, 12e, 12f, and 12g. Therefore, it is considered that, when ESD is applied to the n-channel LDMOS transistor, a current flows to the drain active area 12d with high ESD resistance first and sequentially flows to the other drain active areas 12a, 12b, 12c, 12e, 12f, and 12g.

It is considered that, since the drain active area 12d with high ESD resistance receives a large amount of current first when ESD is applied, the same effect of improving the ESD resistance as that when the width of all of the drain active areas increases is obtained.

The width of the drain active area 12d is preferably equal to or greater than 1.2 μm, more preferably equal to or greater than 1.5 μm, and most preferably equal to or greater than 2 μm in order to achieve high ESD resistance.

In addition, the width of the drain active area 12d is preferably equal to or greater than two times the width of the drain active areas 12a, 12b, 12c, 12e, 12f, and 12g and more preferably equal to or greater than three times the width of the drain active areas 12a, 12b, 12c, 12e, 12f, and 12g in order to achieve high ESD resistance.

The width of the drain active areas 12a, 12b, 12c, 12e, 12f, and 12g is preferably equal to or less than 0.5 μm in order to reduce the on-resistance RonA.

According to this embodiment, it is possible to achieve an n-channel LDMOS transistor which has high ESD resistance and low on-resistance RonA.

Second Embodiment

A semiconductor device according to this embodiment differs from the semiconductor device according to the first embodiment in that at least one of a plurality of first semiconductor areas is located at the end. Hereinafter, the description of the same content as that in the first embodiment will not be repeated.

Figure 5:
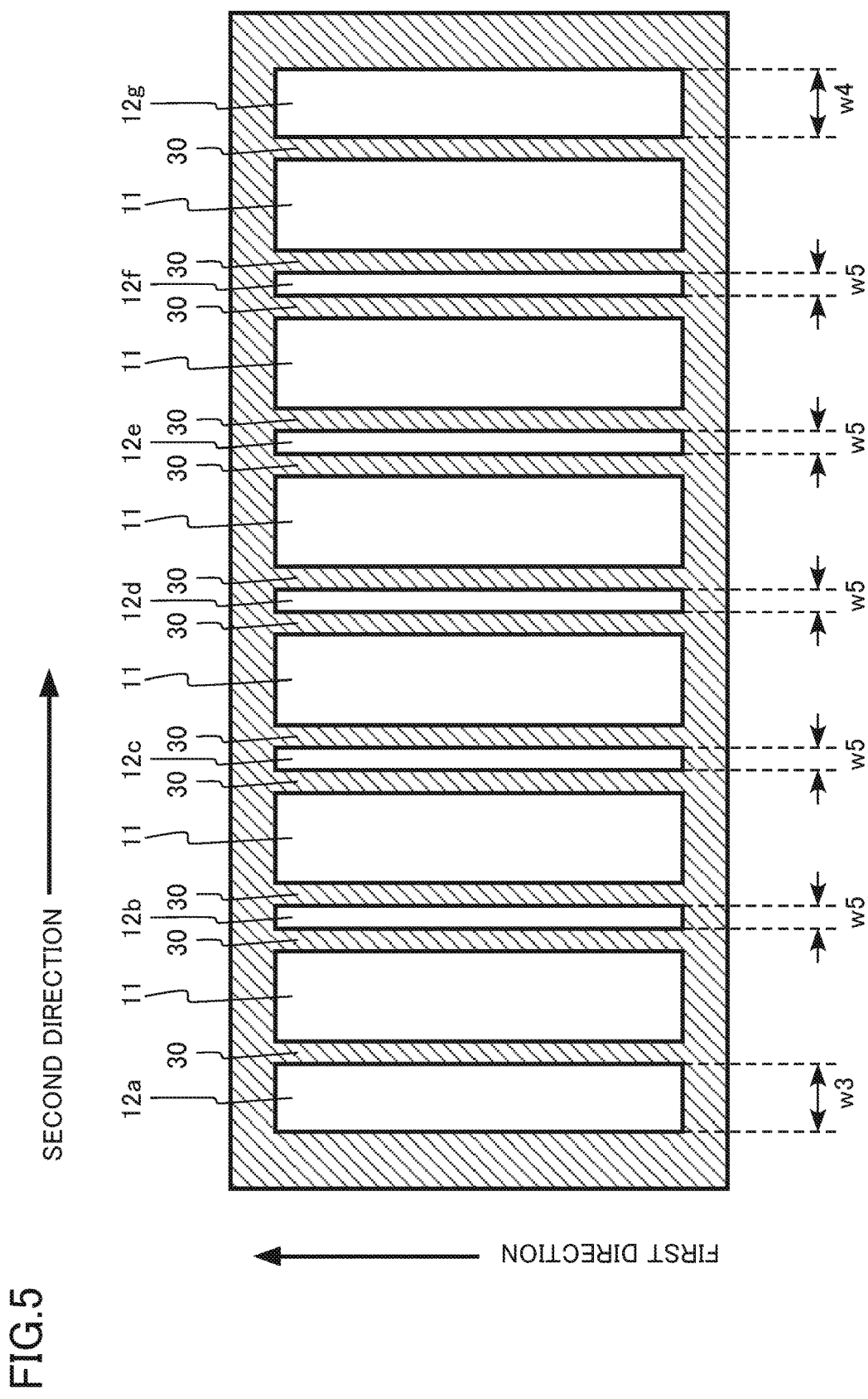
FIG. 5 is a diagram schematically illustrating a semiconductor device according to a second embodiment.

FIG. 5 is a diagram schematically illustrating the semiconductor device according to this embodiment. FIG. 5 is a top view.

Among drain active areas 12a, 12b, 12c, 12d, 12e, 12f, and 12g, the width (w3 in FIG. 5) of the drain active area 12a located at the end and the width (w4 in FIG. 5) of the drain active area 12g located at the end are greater than the width (w5 in FIG. 5) of the other drain active areas 12b, 12c, 12d, 12e, and 12f.

Among the plurality of drain active areas 12a, 12b, 12c, 12d, 12e, 12f, and 12g, the drain active area 12a or the drain active area 12g located at the end is a singular point and breakdown tends to be likely occur in the drain active area 12a or the drain active area 12g due to ESD. In this embodiment, particularly, since the width of the drain active area 12a and the drain active area 12g located at the end increases, it is possible to further improve ESD resistance.

According to this embodiment, it is possible to achieve an n-channel LDMOS transistor which has high ESD resistance and low on-resistance RonA, similarly to the first embodiment.

In the embodiment, the example in which the number of drain active areas is 7 has been described. However, the number of drain active areas is not limited to 7. For example, three or more drain active areas may be provided.

In the embodiment, the n-channel LDMOS transistor has been described as an example. However, when the invention is applied to a p-channel LDMOS transistor, it is possible to obtain the same effect as described above. In the case of the p-channel LDMOS transistor, the first conductivity type is a p type and the second conductivity type is an n type.

While certain embodiments have been described, these embodiments have been presented by way of example only, and are not intended to limit the scope of the inventions. Indeed, the semiconductor devices described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
   a semiconductor substrate having a first plane and a second plane;
   a plurality of insulator regions provided in the semiconductor substrate on a first plane side of the semiconductor substrate;
   a plurality of first semiconductor areas provided on the first plane, the first semiconductor areas extending in a first direction, each of the plurality of first semiconductor areas being interposed between two of the plurality of insulator regions;
   a plurality of second semiconductor areas provided on the first plane, the plurality of second semiconductor areas extending in the first direction, the plurality of second semiconductor areas being provided between the plurality of first semiconductor areas;
   a plurality of first-conductivity-type drain regions provided in the plurality of first semiconductor areas;
   a plurality of first-conductivity-type source regions provided in the plurality of second semiconductor areas;
   a plurality of gate electrodes provided between the plurality of first-conductivity-type drain regions and the plurality of first-conductivity-type source regions, the plurality of gate electrodes provided above the plurality of second semiconductor areas and the plurality of insulator regions;
   a plurality of first-conductivity-type first impurity regions provided between the plurality of first-conductivity-type drain regions and the second plane, the plurality of first-conductivity-type first impurity regions having a lower first-conductivity-type impurity concentration than the plurality of first-conductivity-type drain regions; and
   a plurality of second-conductivity-type second impurity regions provided between the plurality of first-conductivity-type source regions and the second plane,
   wherein a width of at least one first semiconductor area among the plurality of first semiconductor areas is greater than a width of the other first semiconductor areas,
   wherein the two of the plurality of insulator regions interposing each of the plurality of first semiconductor areas are provided in a same one of the plurality of first-conductivity-type first impurity regions.

2. The semiconductor device according to claim 1, wherein the at least one first semiconductor area among the plurality of first semiconductor areas is located at an end of the plurality of first semiconductor areas.

3. The semiconductor device according to claim 1, wherein the width of the at least one first semiconductor area is equal to or greater than two times the width of the other first semiconductor areas.

4. The semiconductor device according to claim 1, wherein the width of the at least one first semiconductor area is equal to or greater than 1.2 μm.

5. The semiconductor device according to claim 1, wherein the width of the other first semiconductor areas is equal to or less than 0.5 μm.

6. The semiconductor device according to claim 1, further comprising:
   a second-conductivity-type third impurity region provided between the first-conductivity-type first impurity region and the second plane, the second-conductivity-type third impurity region having a lower second-conductivity-type impurity concentration than the second-conductivity-type second impurity region;
   a first-conductivity-type fourth impurity region provided between the first-conductivity-type first impurity region and the second-conductivity-type third impurity region, the first-conductivity-type fourth impurity region having a higher first-conductivity-type impurity concentration than the first-conductivity-type first impurity region; and
   a second-conductivity-type fifth impurity region provided between the first-conductivity-type first impurity region and the first-conductivity-type fourth impurity region, the second-conductivity-type fifth impurity region having a lower second-conductivity-type impurity concentration than the second-conductivity-type second impurity region.

7. The semiconductor device according to claim 6, wherein the first-conductivity-type fourth impurity region includes antimony (Sb).

8. The semiconductor device according to claim 6, wherein the first-conductivity-type impurity concentration of the first-conductivity-type fourth impurity region is equal to or greater than $1 \times 10^{20}$ cm$^{-3}$ and equal to or less than $1 \times 10^{22}$ cm$^{-3}$.

9. The semiconductor device according to claim 1, wherein the semiconductor substrate is made of silicon.

10. The semiconductor device according to claim 1, wherein the first conductivity type is an n type and the second conductivity type is a p type.

\* \* \* \* \*